United States Patent
Fournel et al.

(10) Patent No.: US 8,828,244 B2
(45) Date of Patent: Sep. 9, 2014

(54) METHOD FOR BUILDING A SUBSTRATE HOLDER

(75) Inventors: Frank Fournel, Villard-Bonnot (FR); Laurent Bally, Saint-Georges-de-Commiers (FR); Marc Zussy, Saint Egreve (FR); Dominique Jourde, Seyssins (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 9 days.

(21) Appl. No.: 13/699,154

(22) PCT Filed: May 19, 2011

(86) PCT No.: PCT/EP2011/058119
§ 371 (c)(1),
(2), (4) Date: Nov. 20, 2012

(87) PCT Pub. No.: WO2011/144687
PCT Pub. Date: Nov. 24, 2011

(65) Prior Publication Data
US 2013/0075365 A1 Mar. 28, 2013

(30) Foreign Application Priority Data
May 21, 2010 (FR) .................................. 10 53987

(51) Int. Cl.
- *B44C 1/22* (2006.01)
- *C23F 1/02* (2006.01)
- *H01L 21/687* (2006.01)
- *H01L 21/67* (2006.01)

(52) U.S. Cl.
CPC ............ *C23F 1/02* (2013.01); *H01L 21/68714* (2013.01); *H01L 21/67* (2013.01)
USPC ................... 216/11; 216/79; 216/80; 216/97

(58) Field of Classification Search
CPC .................. H01L 21/76829; H01L 21/76254; H01L 21/68771; H01L 21/76264; H01L 21/31116
USPC .......................................... 216/11, 79, 80, 97
See application file for complete search history.

(56) References Cited

U.S. PATENT DOCUMENTS

| 7,087,538 B2 * | 8/2006 | Staines et al. ................ 438/782 |
| 2006/0075969 A1 | 4/2006 | Fischer |

(Continued)

FOREIGN PATENT DOCUMENTS

WO   WO 2004/015727 A2   2/2004

OTHER PUBLICATIONS

U.S. Appl. No. 13/682,009, filed Nov. 20, 2012, Zussy, et al.

(Continued)

*Primary Examiner* — Binh X Tran
(74) *Attorney, Agent, or Firm* — Oblon, Spivak, McClelland, Maier & Neustadt, L.L.P.

(57) ABSTRACT

A method for making a support of at least one substrate, including: making a stack including at least two substrates, each of the two substrates including two opposite main faces, both substrates being secured to each other such that one of the main faces of a first of the two substrates is positioned facing one of the main faces of the second of the two substrates and against an etch-stop material; etching, through the first of the two substrates and with stop on the etch-stop material, at least one location that can receive a substrate that can be supported by the support.

18 Claims, 3 Drawing Sheets

(56) References Cited

U.S. PATENT DOCUMENTS

Figure 1:
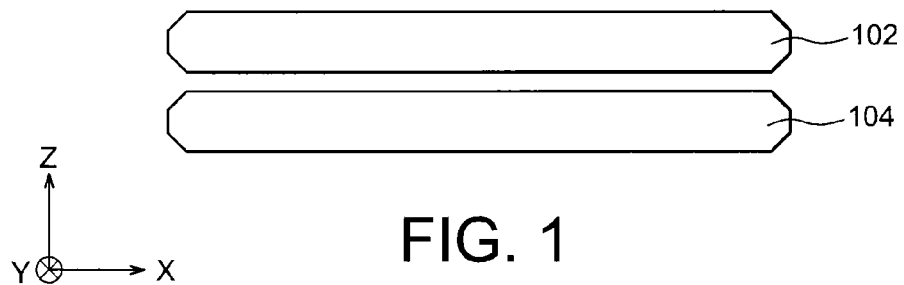

| | | |
|---|---|---|
| 2007/0138601 A1 | 6/2007 | Fan et al. |
| 2007/0155129 A1* | 7/2007 | Thallner ................ 438/455 |
| 2009/0098707 A1* | 4/2009 | Nishihata et al. ............ 438/455 |
| 2009/0258475 A1* | 10/2009 | Endo et al. .................. 438/459 |
| 2010/0144119 A1* | 6/2010 | Kusaba et al. ............... 438/459 |
| 2010/0144131 A1* | 6/2010 | Okuda ........................ 438/530 |
| 2011/0104426 A1* | 5/2011 | Farooq et al. ................ 428/64.1 |
| 2011/0177676 A1* | 7/2011 | Bordel et al. ................ 438/478 |

OTHER PUBLICATIONS

International Search Report issued Jun. 21, 2011 in PCT/EP2011/058119.

U.S. Appl. No. 14/000,354, filed Aug. 19, 2013, Fournel, et al.

\* cited by examiner

METHOD FOR BUILDING A SUBSTRATE HOLDER

TECHNICAL FIELD

The invention relates to the field of substrate or wafer holders, for example used in micro-electronics when it is desired to apply technological operations (deposition of material, etching, etc.) on a substrate, the small size of which is not adapted to the machine(s) performing these technological operations.

STATE OF THE PRIOR ART

By "holder" or substrate support is designated a device which, in a machine normally used for substrates or wafers of diameter $D_1$, allows the use of this machine for substrates with a diameter $D_2$ less than $D_1$. For example, in a CVD (chemical vapor deposition) machine which is generally used for making depositions on substrates with a diameter of 300 mm, it is possible with such a substrate support to produce deposits on a substrate with a diameter of less than or equal to 200 mm without having to carry out a change in the configuration of the machine.

There exists many methods for making such substrate supports. For example, in a substrate of diameter $D_1$, a location or an imprint may be dug, with a diameter $D_2$, with $D_2 < D_1$. Thus, it is possible to have a substrate with a diameter $D_2$ in this location. This location may be made by photolithography and ionic and/or chemical etching in the substrate of diameter $D_1$. It is also possible to make such a location with a mechanical thinning machine including a rectification wheel specifically designed for grinding the center of a substrate while preserving an outer edge of the substrate which will form the edge of the location in which the substrate of diameter $D_2$ will be positioned.

However, such a making of a substrate support poses several problems. First of all, the location should be sufficiently deep so that the substrate of diameter $D_2$ will not easily move out of the location. This depth should therefore be at least equal to half of the thickness of the substrate of diameter $D_2$ because of the double chamfer located on the peripheral edge of the substrate which may cause it to move out of the location in the case of a sudden movement. This has the consequence that the thickness of the support at the location, i.e. between the bottom of the location and the rear face of the support, is relatively thin, which may pose problems of mechanical strength of the support.

For example, in order to process a silicon substrate with a diameter equal to 200 mm and with a thickness equal to 725 µm in a machine which normally processes substrates with a diameter equal to 300 mm and with a thickness equal to 750 µm, a location with a diameter slightly greater than 200 mm and with a depth equal to 350 µm is made in a substrate with a diameter equal to 300 mm and a thickness equal to 750 µm. In this case, the thickness of the bottom wall of the location is equal to 400 µm. With such a location, the substrate with a diameter equal to 300 mm has large flexibility which may cause a too large deformation of the substrate which is positioned in the location when for example loading and unloading steps are carried out by certain robots, make its use impossible with certain machines. This small remaining material thickness at the bottom wall of the location may also very strongly embrittle the support and cause breakage of the support during its handling.

Moreover, the making of such a location by etching in a substrate intended to form the support makes it difficult to control the roughness, flatness and cleanliness of the walls of the location. For example, when the location is made by a mechanical thinning machine, a work-hardened area with a thickness of a few micrometers which may be a very significant source of particles, making the support incompatible with use in a clean room, is formed at the surface of the grinded material. When the location is made by photolithography and chemical or ionic etching, the roughness and flatness of the processed surface are very difficult to control since it is impossible to then rectify the roughness and flatness of the surface made (bottom wall of the location) by conventional chemical-mechanical polishing techniques.

It is also possible to make substrate supports by adhesively bonding for example on the surface of a substrate of diameter $D_1$, portions of materials intended to block the substrate of diameter $D_2$ when it is positioned between these portions of materials. However, such a method poses problems for reproducibility of the positioning of the parts and of resistance to temperature of the adhesive used, the latter should not be degraded during the steps for processing the substrate of diameter $D_2$.

DISCUSSION OF THE INVENTION

An object of the present invention is to propose a novel method for making a substrate support not having the drawbacks of the methods of the prior art, i.e. allowing a substrate support to be made, having good rigidity, advantageously very good resistance to temperature, for example up to temperatures equal to about 1,350° C., absence of particle contamination on its surface, very good roughness and very good flatness of the surface on which is positioned the substrate intended to be supported, and having very good reproducibility in terms of positioning of the substrate intended to be supported.

For this, the invention proposes a method for making a support for at least one substrate, including at least the implementation of the following steps:

making a stack including at least two substrates, each of the two substrates comprising two opposite main faces, both substrates being secured to each other so that one of the main faces of a first of the two substrates is positioned facing one of the main faces of the second of the two substrates and against an etch-stop material, etching, through the first of the two substrates and with stop on the etch-stop material, at least one location able to receive the substrate intended to be supported by the support.

Such a method allows the making of a substrate support with very good control of the depth of the location intended to receive the substrate to be supported since this depth is equal to at least the thickness of one of the two substrates used for forming the support. The desired depth may therefore be adjusted by selecting the first substrate (the one through which the location is made) to be more or less thick. Given that the location is made by etching through this first substrate, this method therefore provides good reproducibility in terms of depth and of positioning of the location.

Further, this support has good rigidity because of the second substrate, the thickness of which is constant on the whole of the support, the location not being etched in this second substrate.

The method according to the invention also gives the possibility of obtaining very good control of the cleanliness (in terms of particle contamination), of the flatness and of the roughness of the bottom wall of the location since the etching of the location is made with stop on the etch-stop material.

The roughness of the bottom wall of the thereby made location may even be sufficiently low in order to allow bonding by capillarity or by direct bonding of the substrate which is positioned in the location. This possibility of bonding when performing processing operations of the substrate positioned in the location of the support, therefore allows positioning of the support at the vertical, or even turning it over during the transport and/or the processing of the substrate, and this without being forced to add maintaining elements at the front face of the processed substrate. Thus, the whole of the front face of the substrate which is positioned in the location remains accessible, even when the support is turned over.

The term "substrate", which is equivalent to the terms "wafer", "plate", "platelet" or further "layer", designates both the object intended to be supported by the support according to the invention and which is designated by the expression "substrate intended to be supported by the support", and the layers being used for making the support according to the invention and which are designated by the expression "two substrates".

Advantageously, both substrates may be secured together by direct bonding or by anodic bonding or by eutectic bonding. Such a bonding of the substrates allows improvement in the resistance of the support to temperature, which may in this case be exposed to high temperatures, or even very high temperatures, (of the order of 1,350° C. for silicon substrates), notably in the case of direct bonding or anodic bonding. This temperature resistance of the support therefore allows technological steps at such temperatures such as epitaxy steps to be applied on the substrate, intended to be supported by the support.

Both substrates may have thicknesses substantially similar and/or sections with substantially similar dimensions, in a plane substantially parallel to one of the main faces of both substrates.

Both substrates may have disk-shaped sections, in a plane parallel to one of the main faces of both substrates, a section of the location, in a plane parallel to one of the main faces of both substrates, may have the shape of a disk with a diameter smaller than the diameters of said sections of both substrates. Thus, the support may be made from standard substrates in the form of cylindrical platelets (wafers).

The first of the two substrates may comprise at least one material able to be selectively etched relatively to at least one material of the second of the two substrates forming the etch-stop material. Thus, the second of the two substrates may form an etch-stop layer when making the support.

Alternatively, the stack may further include an etch-stop layer positioned between both substrates.

In this case, the stack may be made by applying the following steps:
 making the etch-stop layer on at least one of the main faces of at least one of the two substrates,
 securing both substrates together via the etch-stop layer.

The etch-stop layer may be made by thermal oxidation of both substrates, which may form an oxide-based layer at least on the main faces of both substrates, and/or the securing of both substrates together may be achieved by bonding and thermal sealing both substrates.

The method may further include, between the making of the etch-stop layer and the securing of both substrates together, chemical cleaning of the surfaces of both substrates.

The method may further include, after etching the location with stop on the etch-stop layer, a step for etching the etch-stop layer which is found in the location such that the bottom wall of the location is formed by at least one portion of the second of the two substrates.

The stack may further include at least one additional material layer positioned between the etch-stop layer and the second of the two substrates, the method may further include after etching the location with stop on the etch-stop layer, a step for etching the etch-stop layer which is found in the location such that the bottom wall of the location is formed by at least one portion of the additional material layer.

Thus, it is possible that the bottom wall of the location is either formed by the etch-stop layer, or by the second of both substrates, or else by another layer positioned between the etch-stop layer and the second substrate. This selection may be made depending on the nature and the desired properties relating to the material intended to form the bottom wall of the location. Thus, the material forming the bottom wall of the location may be a good heat insulator, and for example comprising silicon oxide. This silicon oxide may be the material of the etch-stop layer which may be obtained by thermal oxidation of the substrates when they comprise silicon. In another case, the material forming the bottom wall of the location may be a good heat conductor, and for example may comprise silicon. This silicon may be the material of the second substrate exposed by etching the etch-stop layer which is found at the bottom of the location, or else when the silicon of the second substrate forms the etch-stop material (for example when the first substrate comprises glass). In another case, the material forming the bottom wall of the location may be electrically conducting in order to facilitate evacuation of electric charges from the substrate positioned in the location. This electrically conducting material may for example be positioned in the location by deposition performed after etching the location.

The heat or electric conduction between the material forming the bottom wall of the location and the substrate positioned in the location, may be increased when the substrate is bonded, for example by direct bonding, at the bottom of the location.

The etching of the location may be achieved by a first partial etching of the location through a portion of the thickness of the first of the two substrates, and then by a second etching by selective chemical etching through the remainder of the thickness of the first of the two substrates and with stop on the etch-stop material. By completing the etching of the location with selective chemical etching, the cleanliness and roughness obtained at the bottom wall of the location are improved, but also at the side walls of the location. The first partial etching may be carried out by various technological means: grinding, ionic etching, chemical etching, etc.

Advantageously, the depth of the location may be substantially equal to the thickness of the substrate intended to be supported by the support.

The method may further include, between the making of the stack and the etching of the location, the implementation of thinning to the first of the two substrates. As thinning may be carried out over the whole surface of the first substrate, it is possible to use standard methods, such as grinding, in order to achieve this thinning. It is thus possible to make a not very deep location, for example allowing easy handling and processing of very thin substrates.

The method may further include, after etching of the location, deposition of a material layer at least on the bottom wall of the location.

Generally, the thermally and/or electrically conducting or insulating layers may be set into place when making the stack or after having made the stack, for example by making such a deposit.

The method may further include, after etching of the location, a step for etching a portion of the material of the first of the two substrates found at the periphery of the location such that a remaining portion of the first of the two substrates, includes a pattern, the inner surface of which forms side walls of the location and for which an outer surface includes, in a plane parallel to one of the main faces of both substrates, smaller dimensions than those of the second of the two substrates. Such an etching step gives the possibility of lightening the support, for example by reducing the width of the crown defining the contour of the location.

The pattern of the remaining portion of the first of the two substrates may notably include a crown-shaped section, in a plane parallel to one of the main faces of the two substrates.

The method may further include, after etching the location, a step for making at least one aperture through a portion of the material of the first of the two substrates defining the location such that the contour of the location is open. With such an aperture, it is possible to facilitate grasping of the substrate when it is housed at the bottom of the location. It is possible to make one or several apertures from the inside of the location as far as the outside of the location, for example by etching a portion of the material of the first substrate as far as an etch-stop material. This(these) aperture(s) may for example allow the passage of vacuum tweezers or of a robot for grasping the substrate positioned in the location. Thus, the location may only be defined by remaining portions of material distributed over the second substrate according to an initial pattern, for example, a crown.

The support may include a location intended to receive a substrate, or several locations distributed over the surface of the support and able to receive several substrates.

SHORT DESCRIPTION OF THE DRAWINGS

Figure 4:
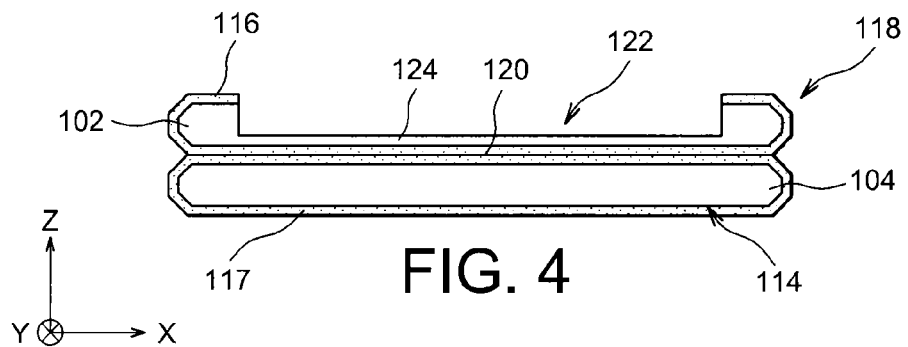
Figure 5A:
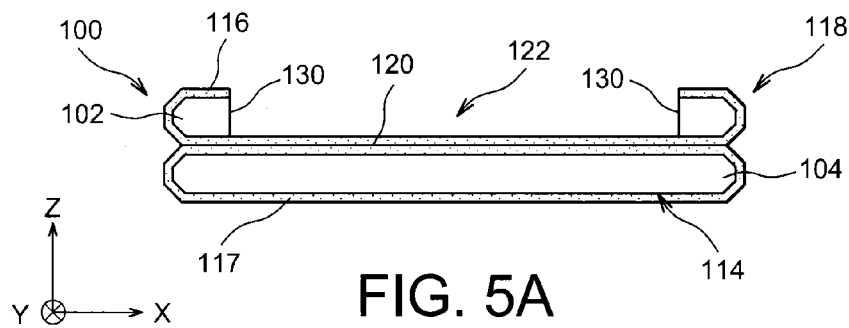
Figure 5B:
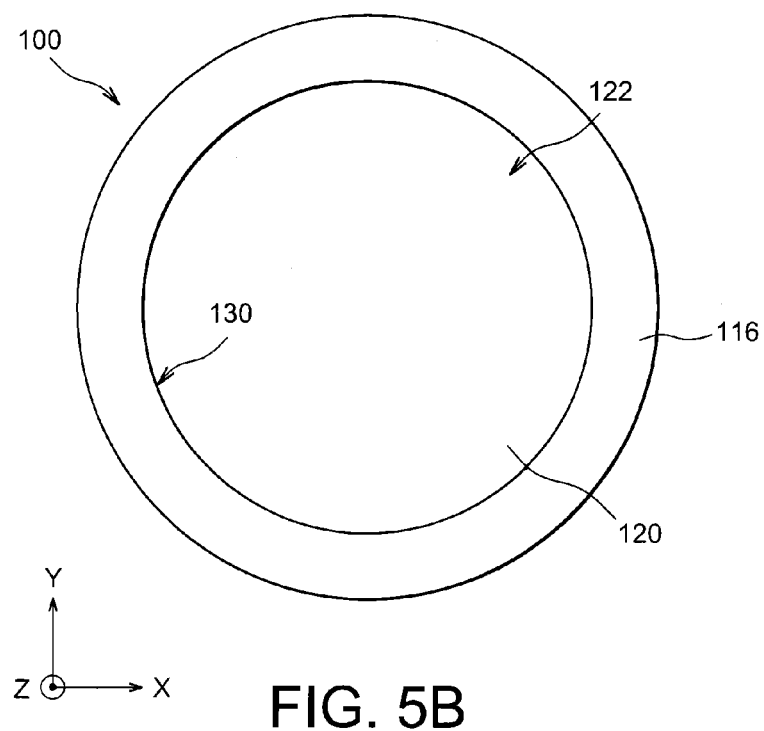
Figure 6A:
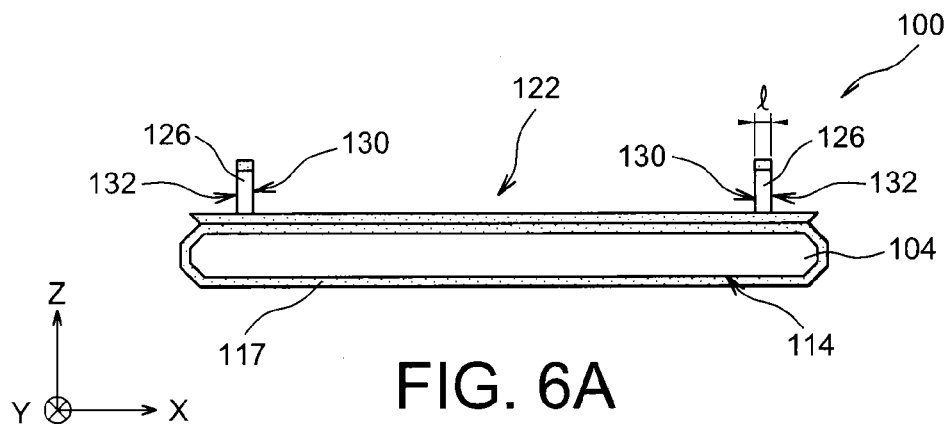
Figure 6B:
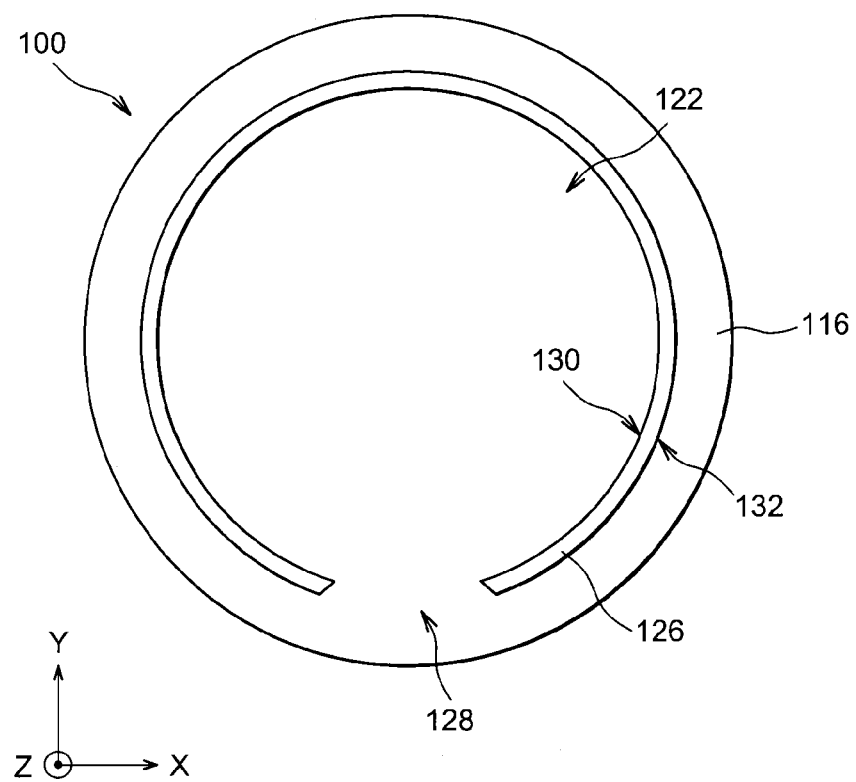

The present invention will be better understood upon reading the description of exemplary embodiments given purely as an indication and by no means as a limitation with reference to the appended drawings wherein:

FIGS. 1 to 5B illustrate the steps of a method for making a substrate support, object of the present invention, according to a particular embodiment, FIGS. 6A and 6B illustrate a substrate support made according to a method, object of the present invention, according to an alternative of the particular embodiment.

Identical, similar or equivalent portions of the different figures described hereafter bear the same numerical references so as to facilitate passing from one figure to the next.

The different portions illustrated in the figures are not necessarily illustrated according to a uniform scale, in order to make the figures more legible.

The different possibilities (alternatives and embodiments) have to be understood as not being exclusive of each other and may be combined with each other.

DETAILED DISCUSSION OF PARTICULAR EMBODIMENTS

Reference is made to FIGS. 1 to 5B which illustrate the steps of a method for making a substrate support 100 according to a particular embodiment.

This support 100 is intended to receive a substrate, for example comprising silicon, with a diameter equal to 200 mm in order to be able to process the substrate in one or several machines normally operating with a silicon substrate with a diameter of 300 mm. The substrate intended to be supported by the support 100 may have a diameter comprised between about 50 mm and 300 mm and a thickness comprised between about 5 µm and 750 µm.

As illustrated in FIG. 1, a first substrate 102 and a second substrate 104 will be used for making the support 100. Both substrates 102 and 104 here comprise single-crystal silicon and each feature a diameter equal to about 300 mm and a thickness equal to about 750 µm. Generally, the diameter of the substrate 102, 104 used for making the support 100 may for example be comprised between about 100 mm and 450 mm, and selected according to the dimensions of the substrate(s) intended to be supported by the support 100. Also, the thickness of the two substrates may for example be comprised between about 525 µm and 1,000 µm, and notably selected according to the thickness of the substrate(s) intended to be supported. Finally, the substrate 102, 104 may comprise Si, Ge, AsGa, InP, sapphire, SiC, molten silica, glass or further GaN. Further, the first and second substrates 102, 104 may either comprise the same material(s) or not.

Figure 2:
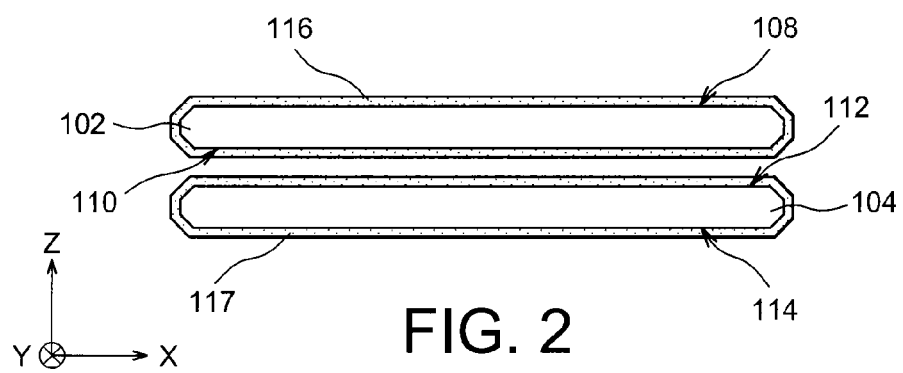

Both substrates 102, 104 are first of all thermally oxidized, forming layers 116, 117 comprising silicon oxide at the surface of the substrates 102, 104 (FIG. 2). These layers 116, 117 for example have a thickness equal to about 150 nm and are obtained here by heat-treating both substrates 102, 104 at 950° C. under an oxidizing atmosphere.

The first substrate 102 therefore includes two opposite main faces 108, 110 and covered by the silicon oxide layer 116. Likewise, the second substrate 104 includes two opposite main faces 112, 114 and covered by the silicon oxide layer 117.

In order to prepare the bonding between both substrates 102, 104, cleaning of the surfaces of the substrates 102, 104 is carried out i.e. of the surfaces of silicon oxide layers 116, 117 given that the whole of the surface of the substrates 102, 104 is covered with these layers 116, 117. Such a cleaning is for example carried out chemically by using a first solution of the $H_2SO_4/H_2O_2$ 3:1 type at a temperature equal to about 180° C. for about 10 mins. Rinsing with deionized water (DI water) is then carried out for a duration equal to about 10 mins. A second solution of the $NH_4OH/H_2O_2/H_2O$ 1:1:5 type is then used at a temperature equal to about 70° C. for about 10 mins. A second rinsing with DI water is finally carried out for a duration equal to about 10 mins.

Figure 3:
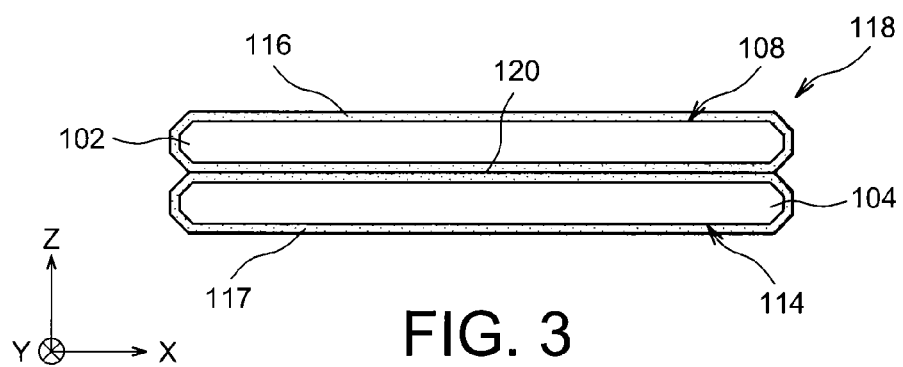

As illustrated in FIG. 3, both substrates 102 and 104 are secured to each other by direct bonding, by putting into contact the layers 116 and 117 comprising silicon oxide and by carrying out annealing of the whole at a temperature for example equal to about 1,100° C. for a duration equal to about 2 hours. Both substrates 102, 104 thereby secured to each other via the oxide layers 116, 117 form an assembly 118 from which the substrate support 100 will be made. The portions of the silicon oxide layers 116, 117 found between the faces 110, 112 of the substrates 102, 104 here form a layer 120 of silicon oxide positioned between both substrates 102, 104. This layer 120 will be used subsequently as an etch-stop layer during etching of the location(s) in which the substrate(s) to be supported is intended to be positioned. It is also possible that both substrates 102, 104 are bonded by anodic bonding or eutectic bonding.

Generally, the etch-stop material used may comprise silicon oxide, silicon nitride, a silicon-germanium alloy, germanium, silicon, or any material of the III-V and/or II-VI type given that the material of the first substrate 102 can be selectively etched relatively to the etch-stop material. Further, it is also possible that several etch-stop layers are positioned between the first and the second substrate 102, 104.

In an alternative, it is possible to achieve, after bonding both substrates 102, 104 to each other, thinning of the first substrate 102 over the whole of its surface. Such thinning corresponds here to suppressing the portion of the silicon oxide layer 116 found above the upper face 108 of the first substrate 102, and then to thinning the first substrate 102 from the upper face 108. Such thinning is interesting to apply when the substrate intended to be supported by the support 100 has a small thickness, in order to, for example, adjust the thickness to the first substrate 102 to the thickness of the substrate intended to be supported. The first thinned substrate 102 may therefore have a thickness comprised between about 5 μm and the initial thickness of the first substrate 102.

A location 122 or imprint is then made in the assembly 118, the pattern of which substantially corresponds to the shape of the substrate which will be intended to be supported by the support 100. This location 122 has a section here, in the plane (X,Y) illustrated in FIG. 4, with a shape matching that of the substrate to be supported, i.e. a disk shape and has a diameter slightly greater than that of the substrate intended to be positioned in the location 122 and for example equal to about 201 mm (substrate to be supported with a diameter equal to 200 mm). In a first phase, the location 122 is not made through the whole of the thickness of the first substrate 102, but through a portion of the thickness of the first substrate 102, for example about 90% of the thickness of the first substrate 102. Thus, a portion 124 of the first substrate 102, for which the thickness corresponds to around 10% of the total thickness of the first substrate 102, temporarily forms the bottom wall of the location 122.

This first etching of the location 122 in the first substrate 102 is for example achieved by grinding centered with the center of the assembly 118, first of all through the silicon oxide layer 116, and then in the first substrate 102 from the upper face 108 of the first substrate 102, by a mechanical thinning machine including a rectification wheel. As illustrated in FIG. 4, this grinding is completed before reaching the etch-stop layer 120.

Next, the location 122 is completed by carrying out a second etching, here selective chemical etching, for example etching with TMAH (Tetramethyl Ammonium Hydroxide) at a temperature equal to about 80° C., allowing suppression of the portion 124 of the first substrate 102, without etching the remainder of the assembly 118 protected by oxide layers 116, 117, and stop on the silicon oxide layer 120 therefore used here as an etch-stop layer (see FIG. 5A). Given that etching is completed on the stop layer 120, the roughness and the flatness of the bottom wall of the location 122 are almost perfect. There is not either in the location 122 any remainder of ground silicon, avoiding generation of particles at the bottom of the location 122. Further, given that during this selective chemical etching, the side walls of the location 122 are not protected by the silicon oxide of the layers 116, 117, the side walls are also chemically etched, for example over an etching depth equal to about 100 μm, which also gives the possibility of removing the work-hardened area left after completing the grinding at the side walls of the location 122 and of obtaining the same characteristics in terms of roughness and flatness, both at the bottom wall and at the side walls 130 of the location 122.

The thereby made substrate support 100 is also illustrated as a top view in FIG. 5B.

In the example described earlier, the bottom wall of the location 122 is formed by the etch-stop layer 120. In an alternative embodiment, it is possible to etch the portion of the etch-stop layer 120 which forms the bottom wall of the location 122 in order to expose the surface of the second substrate 104. Thus, the bottom wall of the location 122 is in this case formed by the second substrate 104.

In another alternative, it is possible that during the making of the stack 118, a layer of another material is positioned between the etch-stop layer 120 and the second substrate 104. Thus, it is possible to etch the portion of the etch-stop layer 120 which forms the bottom wall of the location 122 in order to expose a surface of this material layer which then forms the bottom wall of the location 122.

Finally, in another alternative, it is also possible to perform, after having completed the etchings forming the location 122, one or several depositions of materials in the location 122 so that the deposited material(s) form(s) the bottom wall of the location 122.

The choice of either one of these alternatives may be made depending on the nature of the desired material at the bottom of the location 122, for example, if it is desired that the walls of the location have thermal and/or electric conducting or insulating properties.

In another alternative embodiment described earlier, and in order to lighten the substrate support 100, it is possible to produce by rectification, or by photolithography and etching, an additional etching of the first substrate 102, at the periphery of the location 122 and as illustrated in FIG. 6A. Thus, after applying such an etching, a remaining portion 126 of the first substrate 102 forms a crown delimiting the location 122. This crown has a width (referenced as 1 in FIG. 6A) for example, equal to about 5 mm. Thus, in such a support 100, more than 97% of the initial material of the first substrate 102 is removed, which considerably lightens the substrate support 100 without embrittling it, given that the second substrate 104 is kept intact.

In order to facilitate the grasping of the substrate intended to be positioned in the location 122, it is possible to make, as illustrated in FIG. 6B, an aperture 128 in the crown formed by the remaining portion 126 of the first substrate 102. This aperture 128 may be made by photolithography and etching, or advantageously by rectification in order to limit the number of technological steps for forming this aperture 128. Although a single aperture 128 is illustrated in the example of FIG. 6B, it is also possible that several apertures 128 be formed through the crown 126. Thus, several separated portions of materials form the contour of the location in which a substrate is intended to be positioned.

In the examples described earlier, the substrates used, both those from which the support 100 is made and the one intended to be supported by the support 100, have a cylindrical shape (a section with the shape of a disk). However, the method may be applied to substrates with shapes other than cylindrical shapes. Further, it is also possible that both substrates 102 and 104 from which the support 100 is made, may be of different dimensions, the first substrate 102 in which the location is made may have dimensions (for example a diameter) smaller than those of the second substrate 104.

Further, it is also possible that the etch-stop layer be made differently from that in the example described earlier. For example, it is possible that the etch-stop layer be only formed on one of the main faces of one of the two substrates 102, 104.

By selecting two substrates 102, 104 comprising two different materials, the first substrate 102 for example comprising glass and the second substrate 104 for example comprising silicon, the surface of the second substrate 104 may be used as an etch-stop layer. In this case, the location 122 may be made by chemical etching by using a solution comprising hydrofluoric acid which very rapidly etches the glass without etching the silicon.

The invention claimed is:

1. A method for making a support of at least one substrate, comprising:
    making a stack including at least two substrates, each of the two substrates including two opposite main faces, both substrates being secured to each other such that one of main faces of a first of the two substrates is positioned facing one of main faces of the second of the two substrates and against an etch-stop material;

etching, through the first of the two substrates and with stop on the etch-stop material, at least one location that can receive the at least one substrate that can be supported by the support.

2. The method according to claim 1, wherein both substrates are secured to each other by direct bonding or by anodic bonding or by eutectic bonding.

3. The method according to claim 1, wherein both substrates have substantially similar thicknesses and/or sections in a plane substantially parallel to one of the main faces of the two substrates of substantially similar dimensions.

4. The method according to claim 1, wherein both substrates have disk-shaped sections, in a plane parallel to one of the main faces of the two substrates, and wherein a section of the location, in a plane parallel to one of the main faces of the two substrates, has a shape of a disk with a diameter smaller than the diameters of the sections of both substrates.

5. The method according to claim 1, wherein the first of the two substrates comprises at least one material that can be selectively etched relatively to at least one material of the second of the two substrates, forming the etch-stop material.

6. The method according to claim 1, wherein the etching of the location is achieved by first partial etching of the location through a portion of a thickness of the first of the two substrates, and then by second etching with selective chemical etching through a remainder of the thickness of the first of the two substrates and with stop on the etch-stop material.

7. The method according to claim 1, wherein a depth of the location is substantially equal to the thickness of the at least one substrate that can be supported by the support.

8. The method according to claim 1, further comprising, between the making of the stack and the etching of the location, thinning the first of the two substrates.

9. The method according to claim 1, further comprising, after etching of the location, depositing a material layer at least on a bottom wall of the location.

10. The method according to claim 1, further comprising, after the etching of the location, making at least one aperture through a portion of the material of the first of the two substrates defining the location such that a contour of the location is open.

11. The method according to claim 1, further comprising, after etching of the location, etching a portion of the material of the first of the two substrates found at a periphery of the location such that a remaining portion of the first of the second substrates includes a pattern, an inner surface of which forms side walls of the location and an outer surface of which, in a plane parallel to one of the main faces of both substrates, includes dimensions smaller than those of the second of the two substrates.

12. The method according to claim 11, wherein the pattern of the remaining portion of the first of the two substrates includes a crown-shaped section, in a plane parallel to one of the main faces of the two substrates.

13. The method according to claim 1, wherein the stack further includes an etch-stop layer positioned between both substrates.

14. The method according to claim 13, further comprising, after etching the location with stop on the etch-stop layer, etching the etch-stop layer found in the location such that a bottom wall of the location is formed by at least one portion of the second of the two substrates.

15. The method according to claim 13, wherein the stack further includes at least one additional material layer positioned between the etch-stop layer and the second of the two substrates, the method further comprising, after etching the location with stop on the etch-stop layer, etching the etch-stop layer found in the location such that a bottom wall of the location is formed by at least one portion of the additional material layer.

16. The method according to claim 13, wherein the stack is made by:

making the etch-stop layer on at least one of the main faces of at least one of the two substrates;

securing both substrates together via the etch-stop layer.

17. The method according to claim 16, wherein the etch-stop layer is made by thermal oxidation of both substrates, forming an oxide-based layer at least on the main faces of the two substrates, and/or wherein the securing of both substrates is achieved by bonding and heat-sealing of both substrates.

18. The method according to claim 16, further comprising, between the making of the etch-stop layer and the securing of both substrates, chemical cleaning of the surfaces of both substrates.

* * * * *